United States Patent
Kanehara

(10) Patent No.: US 7,366,007 B2
(45) Date of Patent: Apr. 29, 2008

(54) SEMICONDUCTOR MEMORY DEVICE

(75) Inventor: Hidenari Kanehara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 118 days.

(21) Appl. No.: 11/435,725

(22) Filed: May 18, 2006

(65) Prior Publication Data

US 2006/0262635 A1 Nov. 23, 2006

(30) Foreign Application Priority Data

May 20, 2005 (JP) ............................. 2005-147429

(51) Int. Cl.
*G11C 11/00* (2006.01)
(52) U.S. Cl. .................. 365/154; 365/230.05
(58) Field of Classification Search ................ 365/154, 365/230.05, 156
See application file for complete search history.

(56) References Cited

U.S. PATENT DOCUMENTS

| | | | |
|---|---|---|---|
| 4,768,168 A * | 8/1988 | Watanabe | ............... 365/189.08 |
| 5,825,691 A | 10/1998 | McClure | |
| 6,166,946 A * | 12/2000 | Naffziger | ..................... 365/154 |
| 6,901,003 B2 | 5/2005 | Adams et al. | |
| 6,917,536 B1 * | 7/2005 | McLaury et al. | ........... 365/154 |
| 7,283,417 B2 * | 10/2007 | Davis et al. | ........... 365/230.03 |

FOREIGN PATENT DOCUMENTS

JP         2001196904 A        7/2001

* cited by examiner

*Primary Examiner*—Anh Phung
(74) *Attorney, Agent, or Firm*—Steptoe & Johnson LLP

(57) ABSTRACT

A semiconductor memory device capable of performing a high-speed write operation at lower voltage without increasing the word line activation period at normal voltage. The memory device has a write circuit including two NMOS transistors respectively having sources connected to ground potential. One of the transistors has a drain connected to one of a pair of bit lines, and the other transistor has a drain connected to the other bit line. The memory device also has a column selecting and data input circuit which generates a logical product of inverted data of data to be written and a write column selecting signal, inputs the logical product to the gate of the one transistor, generates a logical product of the data to be written and the write column selecting signal, and inputs the logical product to the gate of the other transistor.

7 Claims, 8 Drawing Sheets

SEMICONDUCTOR MEMORY DEVICE

FIELD OF THE INVENTION

The present invention relates to a semiconductor memory device, and more particularly, to a method of writing in the semiconductor memory device.

BACKGROUND OF THE INVENTION

A static random-access memory (SRAM), which is one of conventional semiconductor devices, will be described with reference to a circuit diagram in FIG. 6.

As shown in FIG. 6, memory cells 100 are disposed in an array and are each connected to a word line WL and to a pair of bit lines (BIT, NBIT).

As shown in FIG. 7, the memory cell 100 has a total of six transistors, i.e., two PMOS transistors MP1 and MP2 provided as load transistors, two NMOS transistors MN1 and MN2 provided as drive transistors, and two NMOS transistors MN3 and MN4 provided as transfer transistors, whereby a memory cell of an SRAM is formed.

That is, the gates of the two transfer transistors MN3 and MN4 are connected to the word lines WL, and the drains of the transfer transistors MN3 and MN4 are respectively connected to the pair of bit lines BIT and NBIT. The sources of the two load transistors MP1 and MP2 are connected to VDD (power supply potential), while the sources of the two drive transistors MN1 and MN2 are connected to VSS (ground potential). The drain of the load transistor MP1 is connected to the source of the transfer transistor MN3, the drain of the drive transistor MN1, the gate of the load transistor MP2 and the gate of the drive transistor MN2. Also, the drain of the load transistor MP2 is connected to the source of the transfer transistor MN4, the drain of the drive transistor MN2, the gate of the load transistor MP1 and the gate of the drive transistor MN1.

As shown in FIG. 6, a precharge circuit 103, a readout column selector 104 and a write column selector 701 are connected to the pair of bit lines BIT and NBIT, and two PMOS transistors MP5 and MP6 for inverting data DATA and NDATA held by the memory cell 100 are also connected to the pair of bit lines BIT and NBIT. The sources of these transistors MP5 and MP6 are connected to VDD; the gate of the transistor MP5 is connected to the bit line NBIT; the drain of the transistor MP5 is connected to the bit line BIT; the gate of the transistor MP6 is connected to the bit line BIT; the drain of the transistor MP6 is connected to the bit line NBIT.

The precharge circuit 103 is constituted by three PMOS transistors MP7, MP8, and MP9. A precharge signal NPC is input to each of the gates of the PMOS transistors MP7, MP8, and MP9. The transistor MP7 has its source connected to VDD and its drain connected to the bit line BIT. The transistor MP8 has its source connected to VDD and its drain connected to the bit line NBIT. The transistor MP9 has its source and drain connected to the bit lines BIT and NBIT, respectively.

The readout column selector 104 is constituted by two PMOS transistors MP3 and MP4. A readout column selecting signal CR is input to each of the gates of the PMOS transistors MP3 and MP4. The transistor MP3 has its drain connected to the bit line BIT, while the transistor MP4 has its drain connected to the bit line NBIT. The transistors MP3 and MP4 have their sources connected to the readout circuit 105. The readout circuit 105 is connected to the bit lines BIT and NBIT through the readout column selector 104.

The write column selector 701 is constituted by two NMOS transistors MN7 and MN8. A write column selecting signal CW is input to each of the gates of the NMOS transistors MN7 and MN8. The transistor MN7 has its drain connected to the bit line BIT, while the transistor MN8 has its drain connected to the bit line NBIT. The write circuit 702 is constituted by two NMOS transistors MN9 and MN10. The sources of the transistors MN9 and MN10 are connected to VSS. Inverted data of data DI to be written is input to the gate of the transistor MN9, while data DI to be written is input to the gate of the transistor MN10. The source of the transistor MN7 and the drain of the transistor MN9 are connected to each other. The source of the transistor MN8 and the drain of the transistor MN10 are connected to each other.

The operation of the semiconductor memory device having the above-described configuration will be described with reference to FIG. 8 with respect to writing at a voltage lower than a normal voltage.

When writing is started, the precharge signal NPC is made inactive to cancel precharge on the pair of bit lines BIT and NBIT. Simultaneously, the write column selecting signal CW is made active to pull down one of the potentials on the pair of bit lines BIT and NBIT from VDD according to the data signal DI and the inverted data NDI of the data DI.

At this time, since the drive power of the transistors are reduced due to the lower voltage, one of the potentials on the pair of bit lines BIT and NBIT cannot be sufficiently pulled in the period in which the word line WL is active, resulting in failure to invert the data DATA and NDATA held by the memory cell 100, as shown in FIG. 8.

To solve this problem, a method of setting the word line WL activation period (pulse width) longer may be used to sufficiently pull the potentials on the pair of bit lines BIT and NBIT so that the data DATA and NDATA held by the memory cell 100 are inverted.

For example, JP2001-196904A discloses an invention for adjustment of the pulse width in a wide operating voltage range.

However, if the word line WL activation period (pulse width) is increased to correspond to a lower voltage, there is a problem that the word line WL activation period is made to be longer than necessary at the normal voltage, causing reduction in operating frequency. There is also a problem that a need arises for an external command according to the operating voltage.

It is, therefore, an object of the present invention to provide a semiconductor memory device capable of performing a high-speed write operation at a lower voltage, without increasing the word line activation period at the normal voltage.

DISCLOSURE OF THE INVENTION

To achieve the above-described object, according to the present invention, there is provided a semiconductor memory device comprising: a write circuit including two N-type transistors respectively having source connected to ground potential or a negative potential, wherein one of the N-type transistors has a drain connected to one of a pair of bit lines and the other of the N-type transistors has a drain connected to the other of the pair of bit lines; and a column selecting and data input circuit which generates a logical product of inverted data of data to be written and a write column selecting signal, inputs the logical product to the gate of one of the N-type transistors, generates a logical product of the data to be written and the write column selecting signal, and inputs the logical product of the data to be written and the write column selecting signal to the gate of the other of the N-type transistors.

In the above-described arrangement, the sources of the N-type transistors of the write circuit are connected to ground potential and the drains of the N-type transistors are connected to the bit lines, the connections being made without intermediation by a selector circuit. Also, only the single-stage N-type transistor circuit operates at the time of writing. The arrangement therefore ensures that the potential on the bit line can be pulled at a high speed at a voltage lower than a normal voltage, without increasing the word line activation period at the normal voltage, thus enabling low-voltage high-speed writing. Also, the need for an external command according to the operating voltage can be eliminated.

In the semiconduct or memory device of the present invention, the sources of the two N-type transistors of the write circuit may be connected to a negative potential.

With this arrangement, the potential on the bit line is set to the negative potential at the time of writing, thereby enabling writing at a higher speed even at a low voltage lower than the normal voltage.

In the semiconductor memory device of the present invention, the memory cell has two PMOS transistors provided as load transistors, two NMOS transistors provided as drive transistors, and two NMOS transistors provided as transfer transistors, the transistors forming a SRAM memory cell. At the time of writing, the potential on the bit line is set to the negative potential to apply a back bias to at least two of the NMOS transfer transistors of the memory cells connected to word lines not selected.

With this arrangement, the potential on the bit line is set to the negative potential at the time of writing to apply the back bias to the transfer transistors in the memory cells of words not selected connected to the bit line, and the transfer transistors of the memory cells connected to the word lines not selected are thereby made non-conductive to ensure that data in the memory cells connected to the word lines not selected is maintained even when the potential on the bit line becomes negative.

In the semiconductor memory device of the present invention, the column selecting and data input circuit activates the N-type transistors of the write circuit in response to input of the write column selecting signal.

With this arrangement, the write operation is executed in response to input of the write column selecting signal.

In the semiconductor memory device of the present invention, a forward bias may be applied to the N-type transistors of the write circuit.

In this arrangement, the application of the forward bias enables writing to be performed at a higher speed.

As described above, the semiconductor memory device of the present invention can pull the potential on the bit line at a high speed at a voltage lower than a normal voltage, without increasing the word line activation period at the normal voltage, and thus has the advantage of performing high-speed writing even at such low voltage.

DESCRIPTION OF THE EMBODIMENTS

Figure 6:
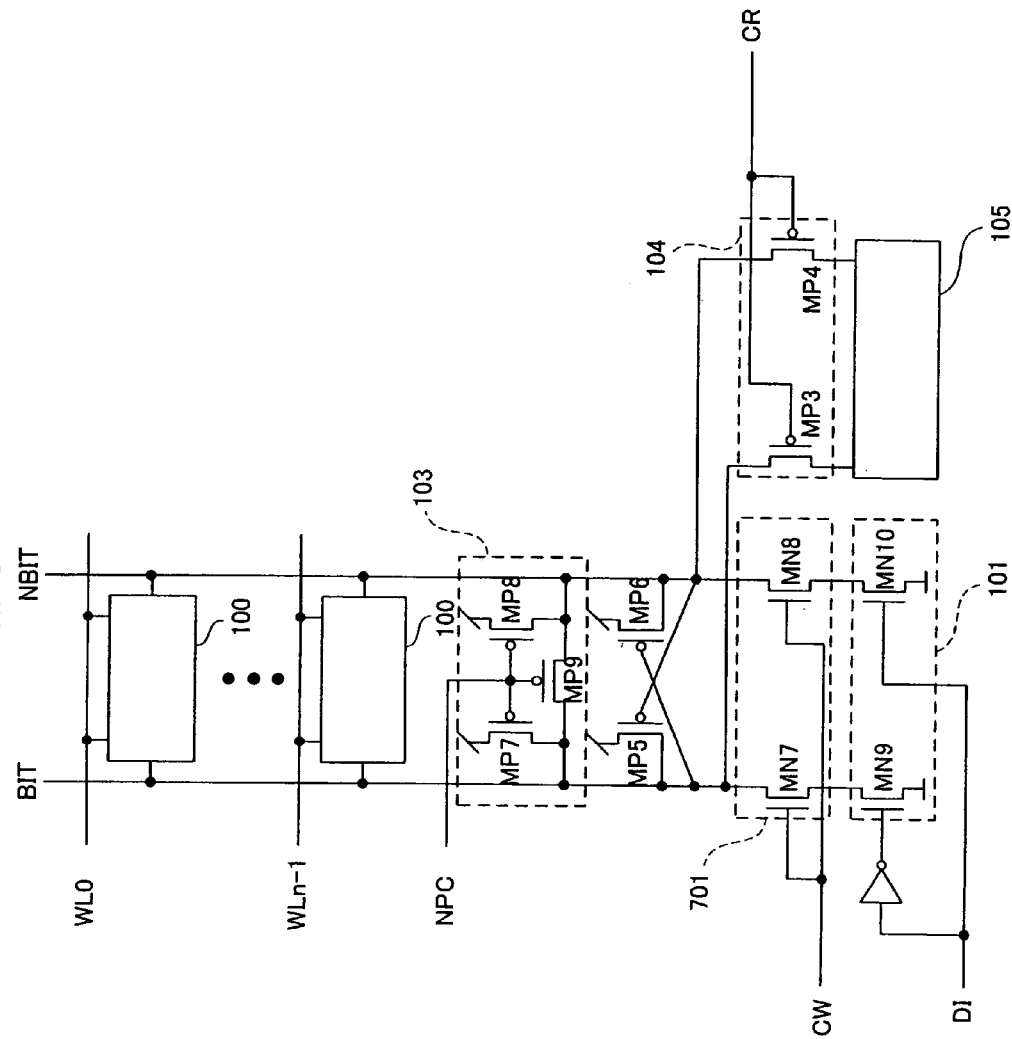
FIG. 6 is a circuit diagram of a conventional semiconductor memory device.
Figure 7:
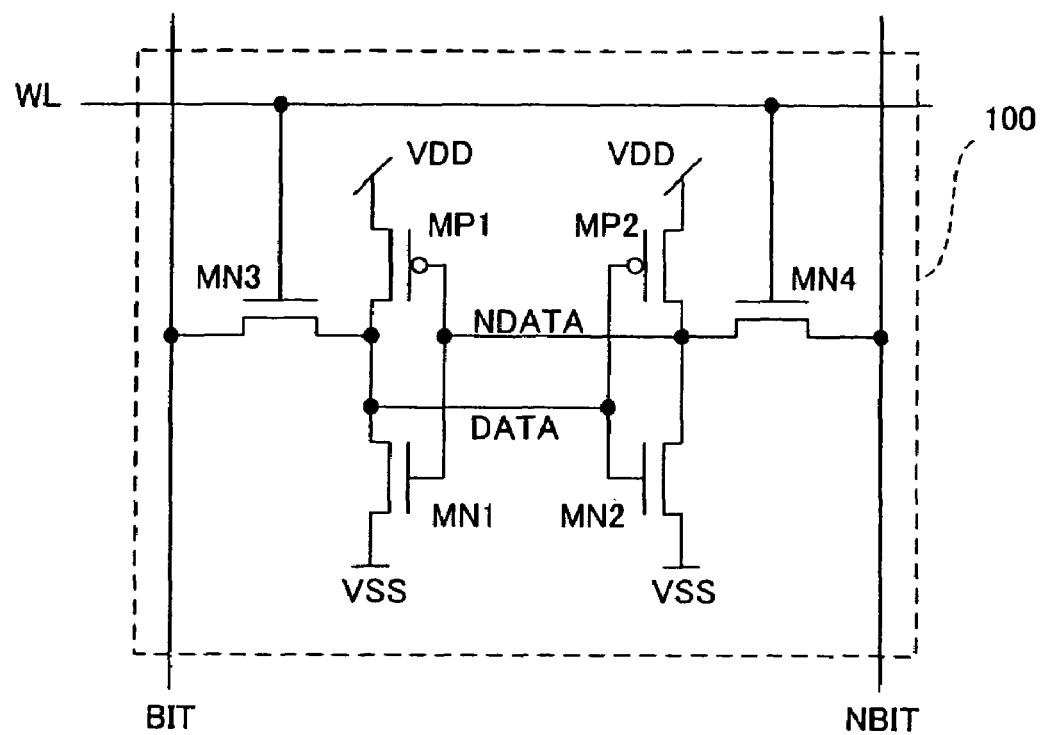
FIG. 7 is a circuit diagram of a memory cell of the conventional semiconductor memory device.
Figure 8:
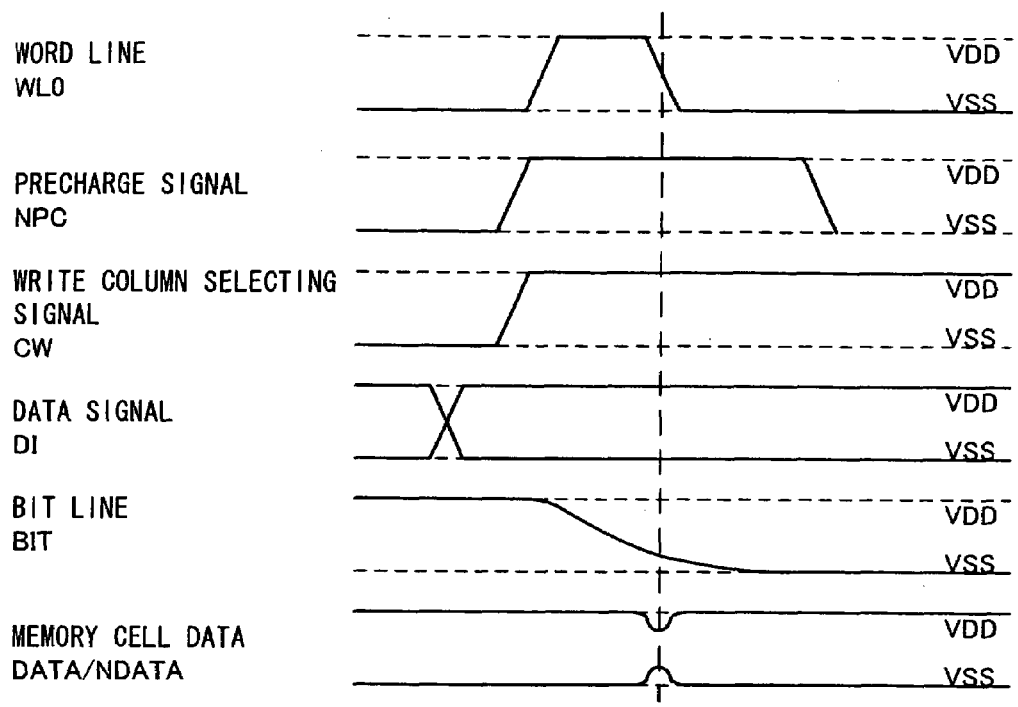
FIG. 8 is a characteristic diagram showing a write operation of the conventional semiconductor memory device.

Embodiments of the present invention will be described below with reference to the accompanying drawings. The same components as those in the semiconductor memory device according to the background (conventional) art shown in FIG. 6 and the same memory cell components as those shown in FIG. 7 are indicated by the same reference characters and the description for them will not be repeated.

Embodiment 1

Figure 1:
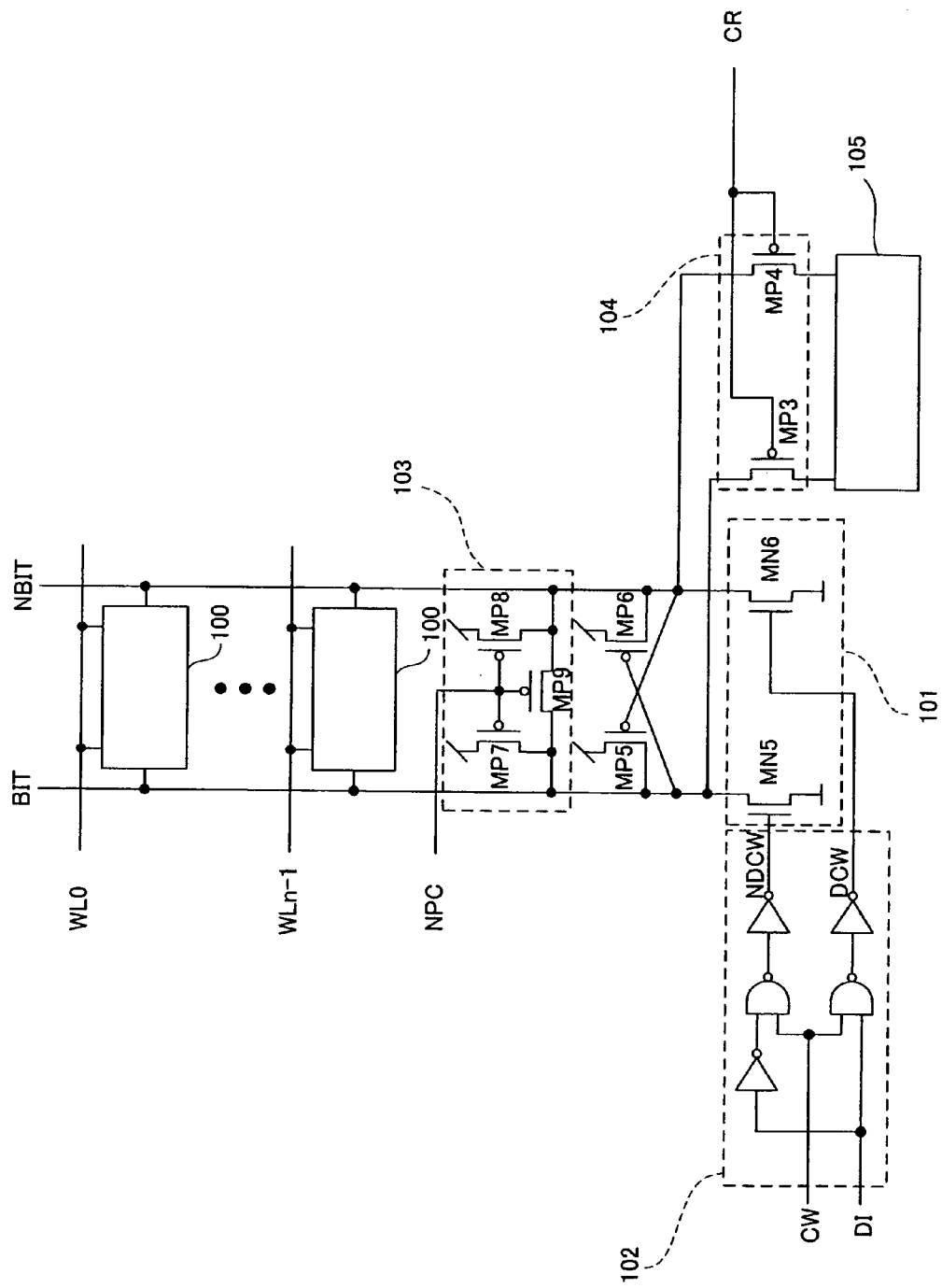
FIG. 1 is a circuit diagram of a semiconductor memory device according to Embodiment 1 of the present invention.

FIG. 1 is a diagram showing the configuration of a semiconductor memory device in Embodiment 1 of the present invention.

In Embodiment 1 of the present invention, a write circuit 101 and a column selecting and data input circuit 102 are provided in place of the write column selector 701 and the write circuit 702 in the background art. The same circuit for the memory cell 100 as that shown in FIG. 7 is also provided.

The write circuit 101 is constituted by two NMOS transistors MN5 and MN6. The sources of the transistors MN5 and MN6 are connected to VSS. The drain of the transistor MN5 is connected to the bit line BIT, while the drain of the N-type transistor MN6 is connected to the bit line NBIT.

In the column selecting and data input circuit 102, a logical product NDCW of inverted data of data DI to be written and the write column selecting signal CW is generated and a logical product DCW of the data DI to be written and the write column selecting signal CW is also generated. The logical product NDCW generated in the column selecting and data input circuit 102 is input to the gate of the transistor MN5 of the write circuit 101, and the logical product DCW generated in the column selecting and data input circuit 102 is input to the gate of transistor MN6.

Figure 2:
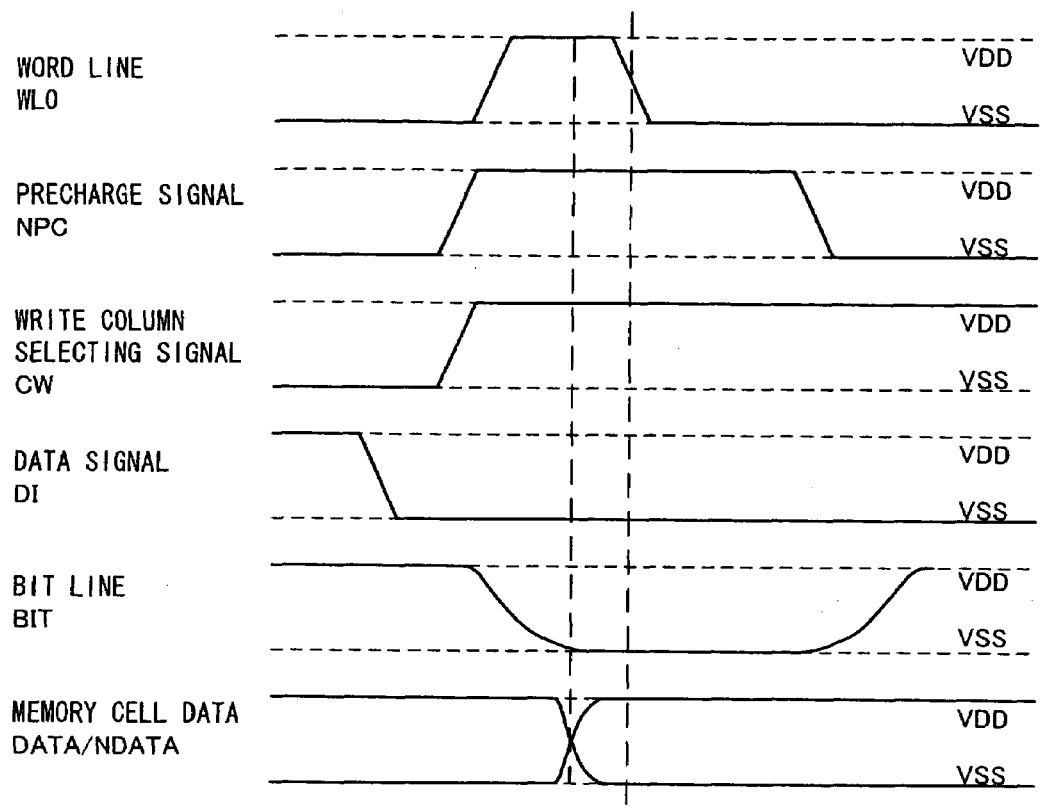
FIG. 2 is a characteristic diagram showing a write operation of the semiconductor memory device.

The operation based on the above-described configuration will be described with reference to FIG. 2 with respect to writing at a low voltage. In the write operation described below, the memory cell 100 connected to the word line WL0 is selected.

The precharge signal NPC becomes HIGH (represented by "H" in the following description) to cancel precharge before the word line WL0 is activated. LOW ("L" in the following description) is input as the data input signal DI. Subsequently, the write column selecting signal CW becomes H. The logical product NDCW is thereby activated to activate the transistor MN5 of the write circuit 101. Subsequently, the column signal on the word line WL0 becomes H (activated) to pull down the potential on the bit line BIT from VDD to VSS.

At this time, since the write circuit 101 connected to the bit lines BIT and NBIT is a single-stage circuit formed by the transistors MN5 and MN6, the potential on the bit line BIT can be pulled down to VSS at a high speed even at a low voltage lower than the normal voltage. As a result, data DATA and NDATA in the memory cell 100 can be rewritten at a high speed.

According to Embodiment 1, as described above, the write circuit (buffer) 101 is connected directly to the bit lines BIT and NBIT without intermediation by a selector circuit, and only the single-stage circuit formed by the transistors MN5 and MN6 suffices for writing. At the time of writing, the potential on the bit line BIT can be pulled at a high speed at a lower voltage, without increasing the word line WL activation period at the normal voltage. Thus, writing can be performed at a high speed even at a low voltage without reducing the operating frequency. Also, the need for an external command according to the operating voltage can be eliminated.

A forward bias may be applied to the N-type transistors MN5 and MN6 constituting the write circuit 101 to reduce the potential on the bit line BIT to VSS at a higher speed. The speed at which data DATA and NDATA in the memory cell is rewritten can be increased in this way to enable writing at a higher speed.

Needless to say, the same effects can also be obtained when the data input signal DI is H.

Embodiment 2

Figure 3:
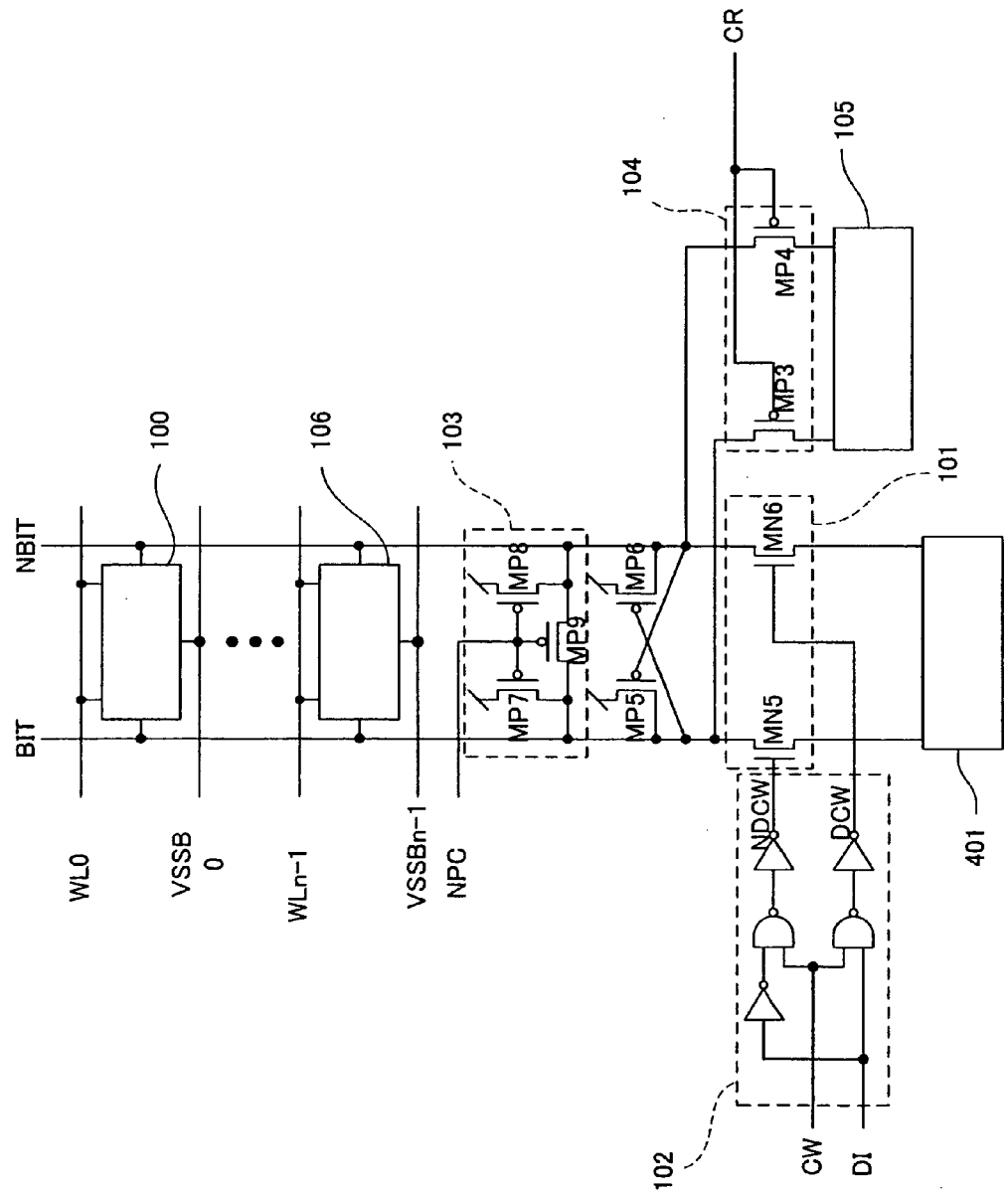
FIG. 3 is a circuit diagram of a semiconductor memory device according to Embodiment 2 of the present invention.

FIG. 3 is a diagram showing the configuration of a semiconductor memory device in Embodiment 2 of the present invention.

In the above-described configuration of Embodiment 1, the sources of the transistors MN5 and MN6 of the write circuit 101 are connected to VSS. In Embodiment 2 of the present invention, the sources of the transistors MN5 and MN6 are connected to a negative power supply circuit 401 set to a negative potential, and the bit line BIT or NBIT is set to the negative potential at the time of writing.

Figure 4:
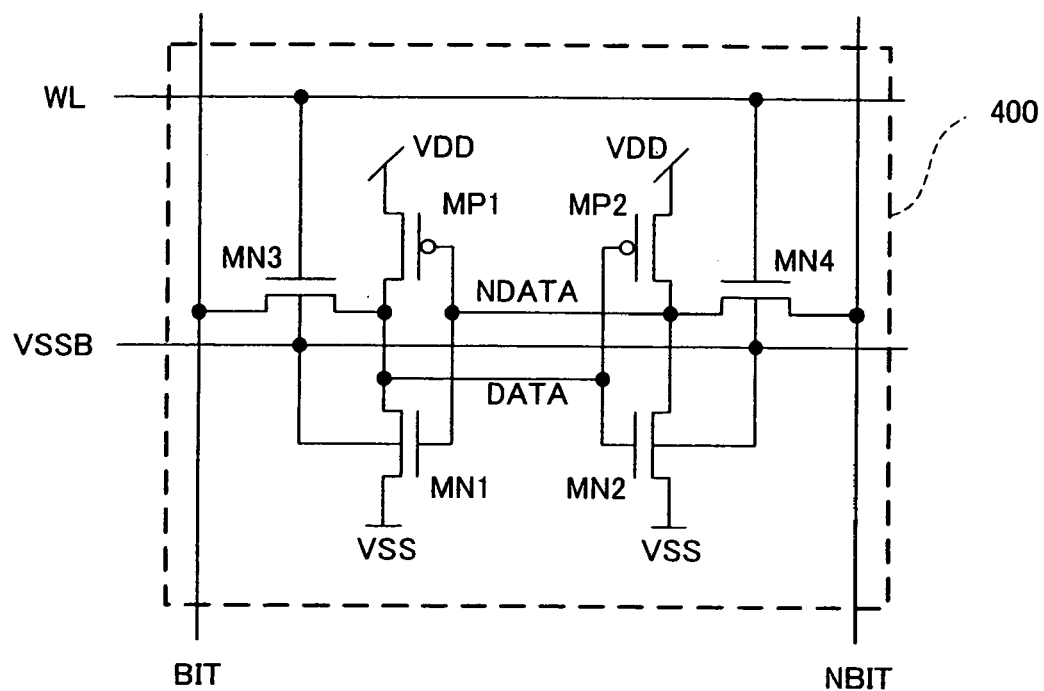
FIG. 4 is a circuit diagram of a memory cell of the semiconductor memory device according to Embodiment 2.

As shown in FIG. 4, the substrates of the four NMOS transistors, i.e., the two drive transistors MN1 and MN2 and the two transfer transistors MN3 and MN4, of the memory cells 100 in each column are respectively connected to potentials VSSB0n to VSSBn-1. Each of the substrate potentials VSSB0n to VSSBn-1 is set lower than VSS to apply a back bias to the four NMOS transistors MN1, MN2, MN3, and MN4.

Figure 5:
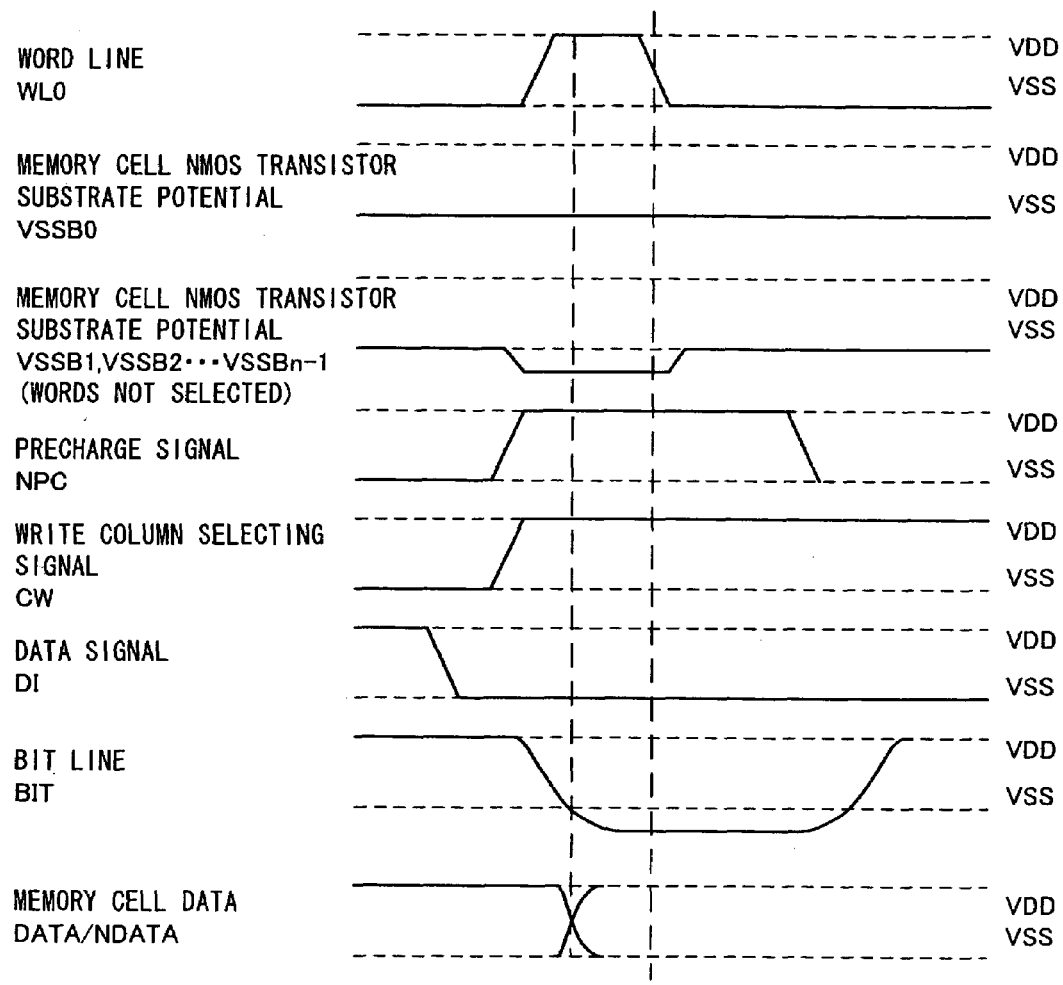
FIG. 5 is a characteristic diagram showing a write operation of the semiconductor memory device according to Embodiment 2.

The operation based on the above-described configuration will be described with reference to FIG. 5 with respect to writing at a low voltage. In the write operation described below, the memory cell 100 connected to the word line WL "0" is selected.

The precharge signal NPC becomes HIGH (represented by "H" in the following description) to cancel precharge before the word line WL0 is activated. LOW ("L" in the following description) is input as the data input signal DI, and the write column selecting signal CW becomes H. The logical product NDCW is thereby activated to activate the transistor MN5 of the write circuit 101. Subsequently, the column signal on the word line WL0 becomes H (activated) to pull down the potential of the memory cell activated by the word line WL0, i.e., the potential on the bit line BIT, from VDD to the negative potential.

At this time, since the circuit required for writing connected to the bit lines BIT and NBIT is a single-stage circuit formed by the transistors MN5 and MN6, and since the potential on the source is set to the negative potential, the potential on the bit line BIT can be pulled down to the potential lower than VSS at a high speed even at a low voltage. As a result, data DATA and NDATA in the memory cell 100 is rewritten at a high speed.

When the word line WL0 becomes H, the source potentials VSSB1, VSSB2, ... VSSBn-1 on the word lines not selected are set to the potential lower than VSS simultaneously or in advance, thereby applying the back bias to the transfer transistors MN3 and MN4 (and the drive transistors MN1 and MN2) in the memory cells 100 set to the negative potential at the time of writing in correspondence with words not selected connected to the bit lines BIT and NBIT. The transfer transistors MN3 and MN4 of the memory cells 100 connected to the word lines not selected are thereby set in the non-conductive state, so that the data in the memory cells 100 connected to the word lines not selected is maintained even when the potential on the bit lines BIT and NBIT becomes negative.

According to Embodiment 2, as described above, the write circuit (buffer) 101 is connected directly to the bit lines BIT and NBIT without intermediation by a selector circuit, and only the single-stage circuit formed by the transistors MN5 and MN6 suffices for writing. Also, the sources of the NMOS transistors MN5 and MN6 of the write circuit 101 are connected to the negative power supply circuit 401 to set the potential on the BIT lines BIT and NBIT to a negative potential at the time of writing, thus enabling writing to be performed at a higher speed even at a low voltage, without increasing the word line WL activation period at the normal voltage, and without reducing the operating frequency. Also, the need for an external command according to the operating voltage can be eliminated.

A forward bias may be applied to the NMOS transistors MN5 and MN6 constituting the write circuit 101 to reduce the potential on the bit line BIT to VSS at a higher speed. The speed at which data DATA and NDATA in the memory cell is rewritten can be increased in this way to enable writing at a higher speed.

Needless to say, the same effects can also be obtained when the data input signal DI is H.

The semiconductor memory device in accordance with the present invention is characterized by directly connecting the write circuit (buffer) to the bit line without intermediation by a write column selector and is useful as a high-speed semiconductor memory device of low-voltage operation.

What is claimed is:

1. A semiconductor memory device having a plurality of memory cells disposed in grid form, a word line for activating each of the memory cells, and a pair of bit lines connected to each of the memory cells, the semiconductor memory device comprising:

a write circuit comprising two N-type transistors respectively having sources connected to ground potential, wherein one of the N-type transistors has a drain connected to one of the pair of bit lines and the other of the N-type transistors has a drain connected to the other of the pair of bit lines; and a column selecting and data input circuit for generating a logical product of inverted data of data to be written and a write column selecting signal, inputting the logical product to a gate of the one of the N-type transistors, generating a logical product of the data to be written and the write column selecting signal, and inputting the logical product of the data to be written and the write column selecting signal to a gate of the other of the N-type transistors.

2. The semiconductor memory device according to claim 1, wherein the column selecting and data input circuit activates the N-type transistors of the write circuit in response to input of the write column selecting signal.

3. The semiconductor memory device according to claim 1, wherein a forward bias is applied to the two N-type transistors of the write circuit.

4. The semiconductor memory device according to claim 1, wherein the sources of the two N-type transistors of the write circuit are respectively connected to a negative potential.

5. The semiconductor memory device according to claim 4, wherein the column selecting and data input circuit activates the N-type transistors of the write circuit in response to input of the write column selecting signal.

6. The semiconductor memory device according to claim 4, wherein
each memory cell has two PMOS transistors provided as load transistors, two NMOS transistors provided as drive transistors, and two NMOS transistors provided as transfer transistors, the transistors forming a SRAM memory cell, and
upon writing, a back bias is applied to the two NMOS transfer transistors of the memory cell connected to a word line not selected.

7. The semiconductor memory device according to claim 4, wherein a forward bias is applied to the two N-type transistors of the write circuit.

* * * * *